United States Patent
Kang

(10) Patent No.: US 7,659,578 B2
(45) Date of Patent: Feb. 9, 2010

(54) SEMICONDUCTOR DEVICE HAVING VARIABLE THICKNESS INSULATING FILM AND METHOD OF MANUFACTURING SAME

(75) Inventor: Tae-Wook Kang, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 11/247,470

(22) Filed: Oct. 11, 2005

(65) Prior Publication Data
US 2006/0076618 A1    Apr. 13, 2006

(30) Foreign Application Priority Data
Oct. 12, 2004    (KR) ............... 10-2004-0081500

(51) Int. Cl.
*H01L 27/108*    (2006.01)
*H01L 29/94*    (2006.01)
*H01L 29/76*    (2006.01)
*H01L 31/119*    (2006.01)

(52) U.S. Cl. ............. 257/336; 257/347; 257/296; 257/303

(58) Field of Classification Search ......... 257/336, 257/347, 72, 40, 59, 149, 151, 89, 296, 298, 257/300, 303, 306, 308
See application file for complete search history.

(56) References Cited

U.S. PATENT DOCUMENTS

| 5,910,016 | A  | * | 6/1999  | Kazerounian et al. | ........ 438/258 |
| 6,407,393 | B1 | * | 6/2002  | Kim et al.        | ....... 250/370.09 |
| 6,617,203 | B2 | * | 9/2003  | Kim et al.        | ........ 438/149 |
| 7,211,826 | B2 | * | 5/2007  | Park et al.       | ........... 257/72 |
| 2005/0285197 | A1 | * | 12/2005 | Park            | .......... 257/347 |

FOREIGN PATENT DOCUMENTS

| CN | 1405748 A      | 3/2003  |
| CN | 1417863        | 5/2003  |
| JP | 04-219736      | 8/1992  |
| JP | 06-175154      | 6/1994  |
| JP | 2001-281703    | 10/2001 |
| KR | 10-2001-0058684 | 7/2001  |
| KR | 10-2001-0101885 | 11/2001 |
| KR | 10-2002-0054852 | 7/2002  |

OTHER PUBLICATIONS

Office Action issued on Sep. 7, 2007 for corresponding Chinese Application No. 200510124965.2.
An Office Action for corresponding Japanese Patent Application No. 2005-151294, dated Mar. 10, 2009.
An Office Action for corresponding Chinese Patent Application No. 200510124965.2, dated Apr. 18, 2008.
The Korean Patent Registration Gazette for corresponding Korean Patent Application No. 10-2004-0081500, dated Dec. 13, 2006.

* cited by examiner

*Primary Examiner*—Chuong A. Luu
(74) *Attorney, Agent, or Firm*—Knobbe Martens Olson & Bear LLP

(57) ABSTRACT

Embodiments of a semiconductor device capable of increasing an aperture ratio of an organic electroluminescence display device by decreasing the surface area of a capacitor in the organic electroluminescence display device and a method of manufacturing the semiconductor device are disclosed. By forming a gate insulating film of a gate electrode with a thickness different from that of a dielectric film of a capacitor, the surface area of the capacitor can be decreased without variation in capacitance, thereby increasing the aperture ratio of an organic electroluminescence display device.

19 Claims, 3 Drawing Sheets

SEMICONDUCTOR DEVICE HAVING VARIABLE THICKNESS INSULATING FILM AND METHOD OF MANUFACTURING SAME

BACKGROUND OF THE INVENTION

This application claims the priority of Korean Patent Application No. 10-2004-0081500, filed on Oct. 12, 2004, in the Korean Intellectual Property Office, the disclosure of which is incorporated herein in its entirety by reference.

1. Field of the Invention

The present invention relates generally to a semiconductor device and a method of manufacturing the same, and more particularly to a semiconductor device capable of increasing an aperture ratio of an organic electroluminescence display device by decreasing a surface area of a capacitor in the organic electroluminescence display device, and a method of manufacturing the semiconductor device.

2. Description of the Related Technology

In flat panel display devices, such as active matrix organic electroluminescence display devices, also known as organic light emitting diode (OLED) displays, each unit pixel comprises (1) a thin film transistor connected to a gate line, a data line, and a power supply line, (2) a capacitor, and (3) an organic electroluminescence element. The capacitor is formed at the same time as forming the gate line, a gate electrode, the data line, source/drain electrodes, and the power supply line. In such flat panel display devices, a method of increasing the surface area of the capacitor, a method of decreasing the thickness of a dielectric film formed between electrodes of the capacitor, or a method of employing a dielectric film having a high dielectric constant is typically used to enhance the capacitance of the capacitor. However, the method of increasing the surface area of the capacitor may lead to a decrease in aperture ratio, and the method of decreasing the thickness of the dielectric film requires an additional fabrication process, thereby increasing the number of processes required for manufacture.

FIG. 1 is a plan view illustrating an exemplary organic electroluminescence display device. Referring to FIG. 1, the active matrix organic electroluminescence display device comprises a plurality of gate lines 110, a plurality of data lines 120, a plurality of power supply lines 130, and a plurality of pixels connected to the gate lines 110, the data lines 120, and the power supply lines 130.

Each pixel comprises a switching thin film transistor (TFT) 170 connected to the corresponding gate line of the plurality of gate lines 110, and the corresponding data line of the plurality of data lines 120. Each pixel further comprises a driving TFT 150 configured to drive an electroluminescence element 160, wherein the driving TFT 150 is connected to the corresponding power supply line 130, a capacitor 140 configured to store the gate-source voltage of the driving TFT 150, and the electroluminescence element 160.

The driving TFT 150 comprises a semiconductor layer 152 having source and drain regions, a gate electrode 154, and source and drain electrodes 156a, 156b connected to the source and drain regions through contact holes 155a, 155b, respectively. The switching TFT 170 has the same structure as that of the driving TFT 150.

The capacitor 140 comprises a lower electrode 144 which is connected to one of the source and drain electrodes of the switching TFT 170 (the source electrode, for example) and the gate electrode of the driving TFT 150. The capacitor 140 further comprises an upper electrode 146 connected to one of the source and drain electrodes of the driving TFT 150 (the source electrode 156a, for example) and a common power supply line 130. Each pixel electrode 161, which is an anode electrode of the electroluminescence element having an opening, is connected to one of the source and drain electrodes 156a, 156b of the driving TFT 150 (the drain electrode 156b, for example) through a via hole 158.

In the exemplary organic electroluminescence display device described above, one pixel is divided into a non-light-emitting area provided with the TFTs and the capacitor and a light emitting area provided with the electroluminescence element. An increase in the non-light-emitting area correspondingly decreases the light emitting area. However, the capacitor occupies a relatively large area in the pixel, and a high-capacity capacitor is required for increased device integration. Therefore, with the increased area requirement for a high-capacity capacitor in a pixel, the light emitting area is reduced, thereby decreasing the aperture ratio of the organic electroluminescence display device.

SUMMARY OF CERTAIN INVENTIVE ASPECTS

In order to solve the aforementioned problems, embodiments of the invention include a semiconductor device capable of reducing the surface area of a capacitor without additionally performing another mask process, thereby enhancing the aperture ratio of an organic electroluminescence display device. Embodiments of a method of manufacturing a semiconductor device comprise removing a gate insulating film by a predetermined thickness using an ion implanting mask for forming source and drain regions as an etching mask.

According to an aspect of the invention, a semiconductor device comprises a plurality of semiconductor-layer patterns formed on a substrate divided into a first area and a second area, and an insulating film formed on substantially the entire surface of the semiconductor device, including the semiconductor-layer patterns. The insulating film has a first thickness on a part of the first area and the second area that is less than a second thickness on the central portion of the semiconductor-layer pattern in the first area, and the semiconductor device further comprises conductive-layer patterns formed on the insulating film to cover the central portion of the semiconductor-layer pattern in the first area and the semiconductor-layer pattern in the second area.

According to another aspect of the invention, a semiconductor device comprises a plurality of semiconductor-layer patterns on a substrate divided into a first area, a second area, and a third area. The semiconductor device further comprises an insulating film formed on substantially the entire surface of the semiconductor device, including the semiconductor-layer patterns. The insulating layer has a first thickness on a part of the second area and the third area that is less than a second thickness on the first area and the central portion of the semiconductor-layer pattern in the second area. The semiconductor device also comprises conductive-layer patterns formed on the insulating film to cover the central portions of the semiconductor-layer patterns in the first and second areas, and the semiconductor-layer pattern in the third area.

According to another aspect of the invention, a method of manufacturing a semiconductor device comprises forming a plurality of semiconductor-layer patterns on a substrate which is divided into a first area and a second area, and forming an insulating film on the surface of the substrate including the semiconductor-layer patterns. The method further comprises forming a photo-resist pattern on the insulating film to cover the central portion of the semiconductor-layer pattern in the first area, and implanting impurity ions into the semiconductor-layer patterns of the first and second areas using the photo-resist pattern as an ion implanting mask. The method also comprises removing, by a predetermined thickness, the insulating film exposed in the first and second areas using the photo-resist pattern as an etching mask, removing the photo-resist pattern, and forming conductive-layer patterns on the central portion of the semiconductor-layer pattern in the first area, and on the semiconductor-layer pattern in the second area.

According to another aspect of the invention, a method of manufacturing a semiconductor device comprises forming a plurality of semiconductor-layer patterns on a substrate which is divided into a first area, a second area, and a third area, and forming an insulating film on the surface of the substrate including the semiconductor-layer patterns. The method further comprises forming a photo-resist pattern on the insulating film to cover the central portions of the semiconductor-layer patterns in the first and second areas, and implanting a first conductive-type impurity ions with a high concentration into the semiconductor-layer patterns of the second and third areas using the photo-resist pattern as an ion implanting mask. The method further comprises removing, by a predetermined thickness, the insulating film exposed in the second and third areas using the photo-resist pattern as an etching mask, and removing the photo-resist pattern. The method also comprises forming conductive-layer patterns on the central portions of the semiconductor-layer patterns in the first and second areas and on the semiconductor-layer pattern in the third area, implanting the first conductive-type impurity ions with a low concentration into the semiconductor-layer pattern in the second area, and implanting a second conductive-type impurity ions with a high concentration into the semiconductor-layer pattern in the first area.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN EMBODIMENTS OF THE INVENTION

Embodiments of the invention will be described in detail with reference to the accompanying drawings.

Figure 1:
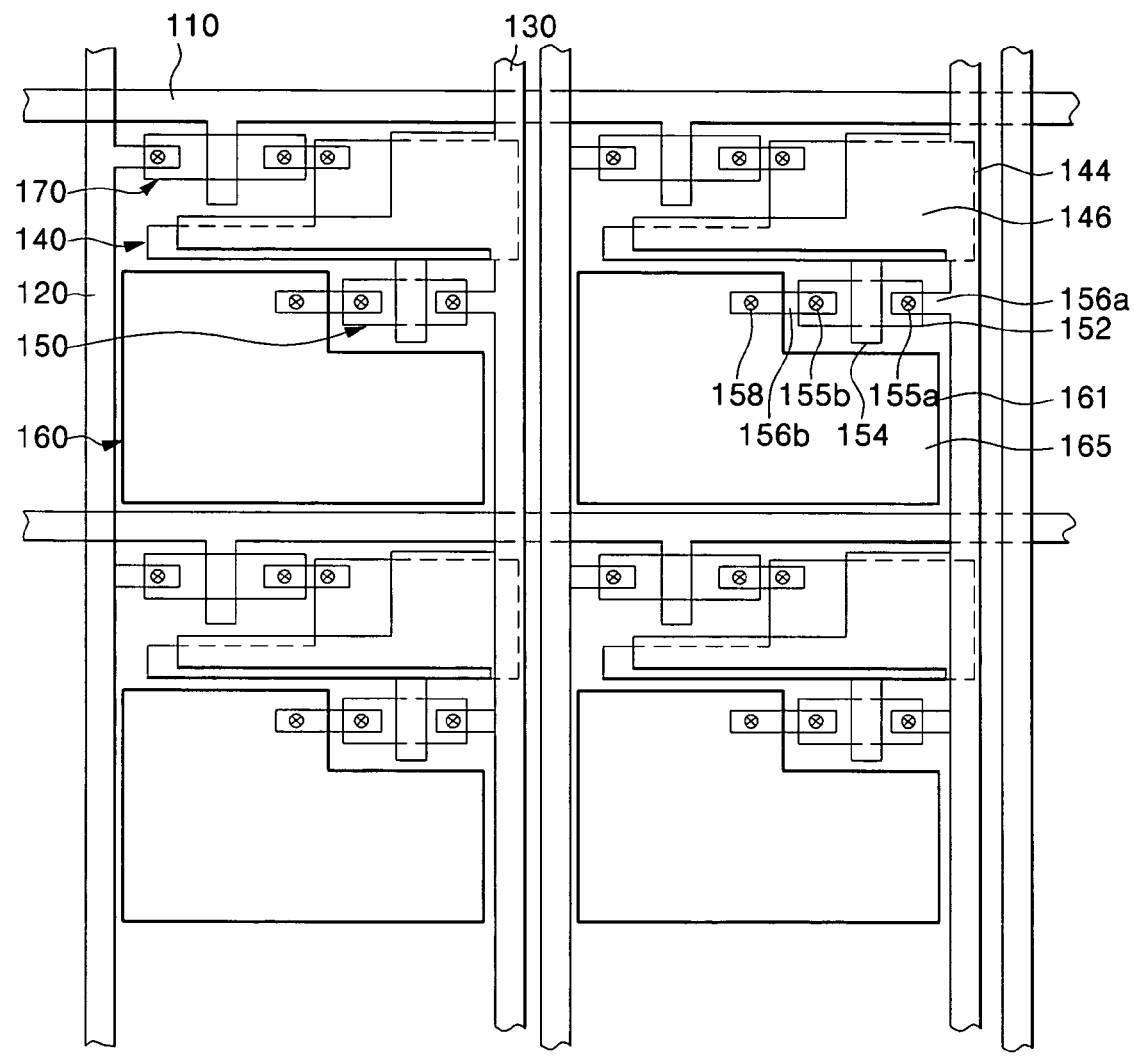
FIG. 1 is a plan view illustrating an exemplary organic electroluminescence display device.
Figure 2A:
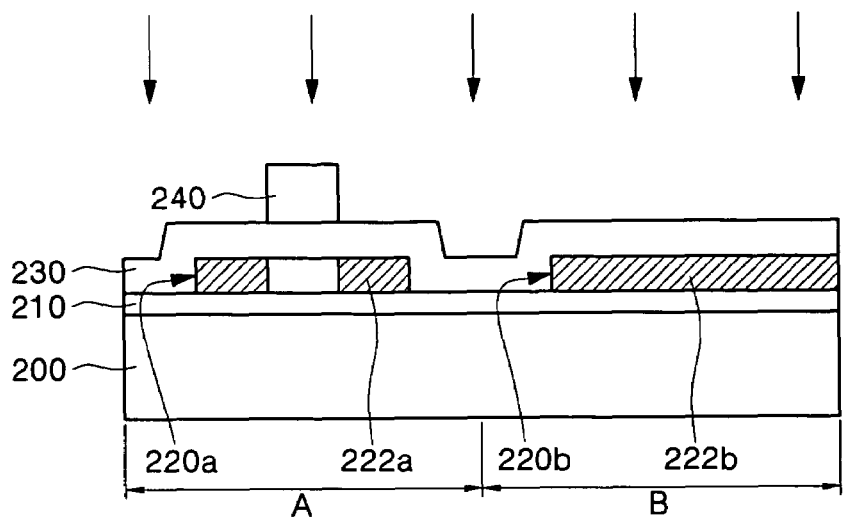
FIG. 2 shows cross-sectional views illustrating one embodiment of a method of manufacturing an organic electroluminescence display device.
Figure 2B:
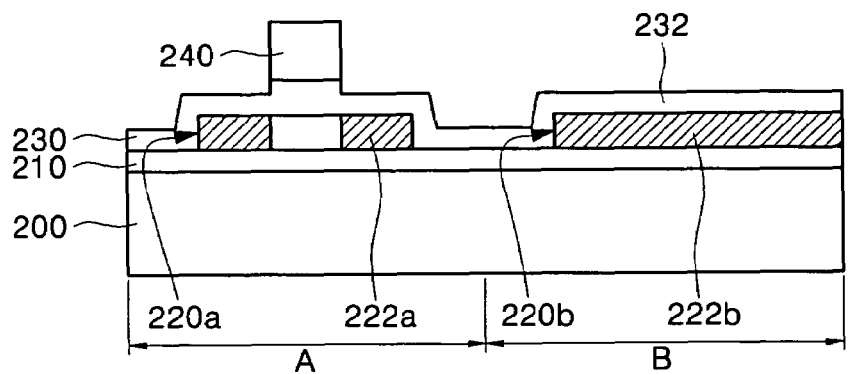
Figure 2C:
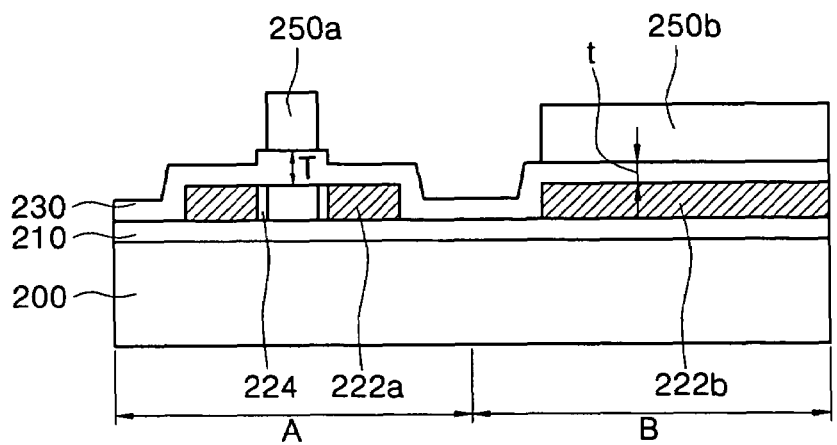

FIGS. 2A to 2C are cross-sectional views illustrating a method of manufacturing a semiconductor device according to an embodiment of the invention, where a substrate is divided into a first area A for an NMOS TFT and a second area B for a capacitor.

The method comprises forming a buffer layer 210 having a predetermined thickness on substantially the entire surface of the substrate 200. In one embodiment, the buffer layer 210 comprises silicon oxide and may be formed using a plasma-enhanced chemical vapor deposition (PECVD) method. The buffer layer 210 advantageously prevents impurities from diffusing into the transparent insulating substrate 200 during crystallization of an amorphous silicon layer formed in the subsequent process.

Following formation of the buffer layer 210, the method further comprises forming the amorphous silicon layer (not shown) as a semiconductor layer, having a predetermined thickness, on the buffer layer 210. Next, the amorphous silicon layer is crystallized using, for example, an excimer laser annealing (ELA) method, a sequential lateral solidification (SLS) method, a metal induced crystallization (MIC) method, or a metal induced lateral crystallization (MILC) method. The crystallized amorphous silicon layer is patterned using a photolithography process, thereby forming polysilicon-layer patterns 220a and 220b on the first area A and the second area B in a unit pixel.

Next, a gate insulating film 230 is formed on substantially the entire resultant surface of the substrate. The gate insulating film 230 may comprise one of a silicon oxide film ($SiO_2$), a silicon nitride film ($SiN_x$), and a stacked structure thereof.

Following formation of the gate insulating film 230, a photo-resist pattern 240 is formed on the gate insulating film 230 to expose the source and drain regions of the first area A and the second area B. Next, by implanting n-type impurities with a high concentration using the photo-resist pattern 240 as an ion implanting mask, the source and drain regions 222a are formed in the first area A, and the lower electrode 222b of a capacitor is formed in the second area B.

After formation of the source and drain regions 222a and the capacitor lower electrode 222b, the gate insulating film 230 in the first area A and the second area B is removed by a predetermined thickness using the photo-resist pattern 240 as an etching mask, thereby forming gate insulating film patterns 232 with different thicknesses in the first area A and the second area B. The thicknesses of the gate insulating film patterns 232 in the first area A and the second area B can be changed in accordance with characteristics of a device and desired capacitance magnitudes for the device. The gate insulating film patterns 232 have a first thickness on a part of the first area A and the second area B that is less than a second thickness on the central portion of the semiconductor-layer pattern 220a in the first area A, wherein the central portion of the semiconductor-layer pattern 220a in the first area A is also the channel region.

Next, the photo-resist pattern 240 is removed, and a conductive layer (not shown) for a gate electrode is formed on substantially the entire resultant surface. The conductive layer for a gate electrode may comprise a single layer of molybdenum (Mo) or molybdenum-tungsten alloy (MoW), a single layer of aluminum (Al) or aluminum-neodymium alloy (Al—Nd), or a double layer of the above-mentioned metals, for example.

Subsequently, a gate electrode 250a is formed in the first area A and an upper electrode 250b of the capacitor is formed in the second area B by etching the conductive layer for a gate electrode using a photolithography process, for example.

The surface area of a capacitor comprising the lower electrode 222b, the gate insulating film pattern 232, and the upper electrode 250b can be expressed by the following equation:

$$A' = \frac{Cst}{\frac{\varepsilon GI}{tGI}} \qquad (1)$$

where $\varepsilon$ denotes a dielectric constant, Cst denotes a capacitance, and tGI denotes the thickness of the gate insulating-film pattern.

According to the above-mentioned equation, because the capacitance Cst needed for the pixel circuit and the dielectric constant ∈ of the gate insulating film are fixed, the surface area A' of the capacitor is determined by the thickness tGI of the gate insulating film pattern used as a dielectric film of the capacitor. Because the thicknesses tGI of the gate insulating film pattern can be changed in accordance with the characteristics and desired capacitance magnitudes of a device as described above, the surface area A' of the capacitor can be changed in accordance with the thickness tGI of the gate insulating film pattern.

Thus, the method of manufacturing a semiconductor device further comprises implanting n-type impurity ions with a low concentration using the gate electrode 250a as an ion implanting mask to thereby form a Lightly Doped Drain (LDD) region 224 in the semiconductor-layer pattern 220a of the first area A.

Thereafter, the source and drain electrodes connected to the source and drain regions are formed to complete a TFT, and a light emitting element connected to the TFT is formed to complete the flat panel display device. The flat panel display device may be an organic electroluminescence device or a liquid crystal display device, for example.

Figure 3A:
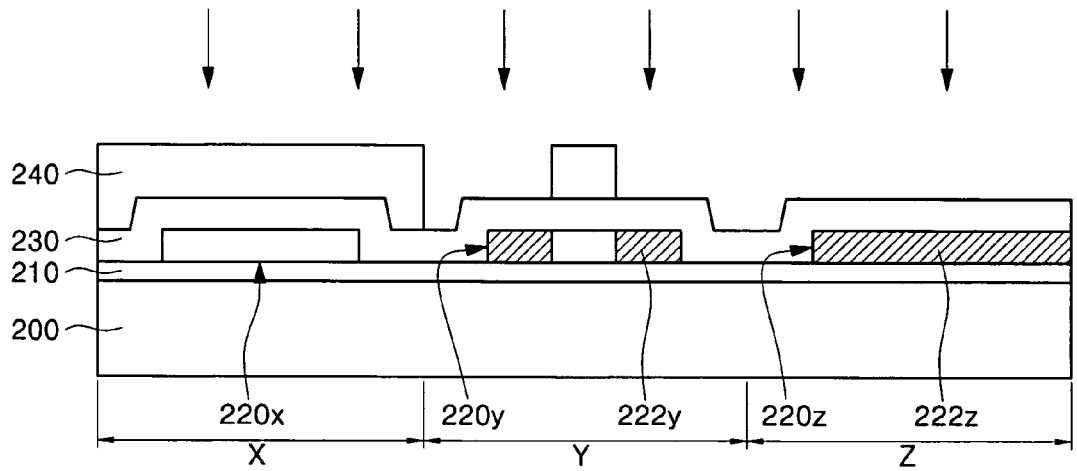
FIG. 3 shows cross-sectional views illustrating another embodiment of a method of manufacturing an organic electroluminescence display device.
Figure 3B:
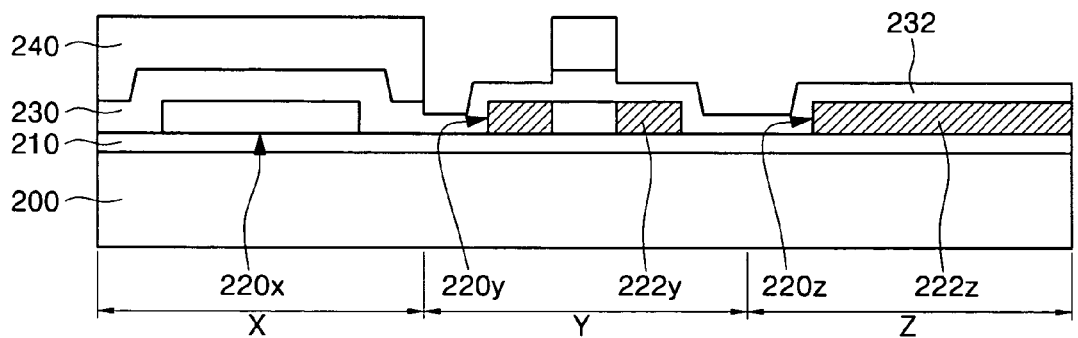
Figure 3C:
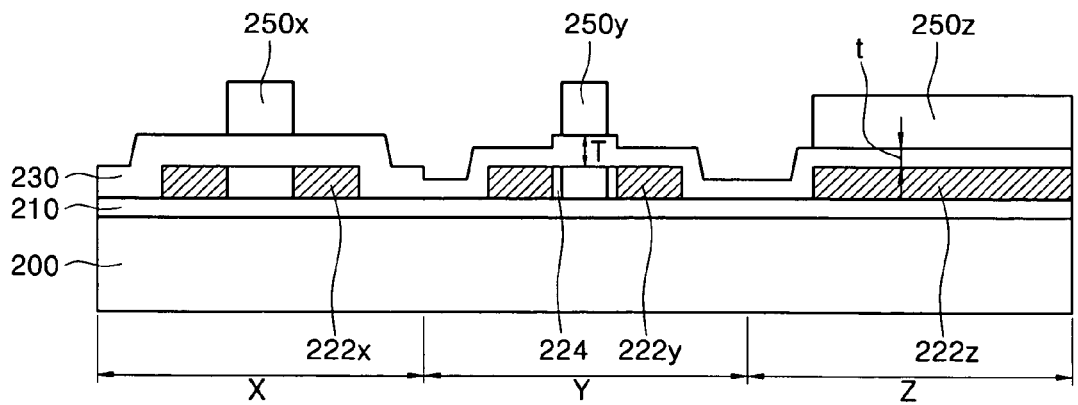

Alternatively, the above-described method can be applied to a structure of a CMOS TFT as described below. FIGS. 3A to 3C are cross-sectional views illustrating a method of manufacturing a semiconductor device according to another embodiment of the invention, wherein a substrate is divided into a first area X for an NMOS TFT, a second area Y for a PMOS TFT, and a third area Z for a capacitor.

In one embodiment of the semiconductor device manufacturing method, a buffer layer 210 having a predetermined thickness is formed on substantially the entire surface of a transparent insulating substrate 200, wherein the buffer layer may comprise silicon oxide and is formed using a plasma-enhanced chemical vapor deposition (PECVD) method, for example. In certain embodiments, the buffer layer 210 advantageously prevents impurities from diffusing into the transparent insulating substrate 200 during crystallization of an amorphous silicon layer formed in the subsequent process.

Following formation of the buffer layer 210, the amorphous silicon layer (not shown) is formed on the buffer layer 210 as a semiconductor layer having a predetermined thickness. Subsequently, the amorphous silicon layer is crystallized using an excimer laser annealing (ELA) method, a sequential lateral solidification (SLS) method, a metal induced crystallization (MIC) method, or a metal induced lateral crystallization (MILC) method, for example. The crystallized amorphous silicon is then patterned using a photolithography process, thereby forming a plurality of polysilicon-layer patterns 220x, 220y, and 220z on the first area X, the second area Y, and the third area Z in a unit pixel.

Next, a gate insulating film 230 is formed on substantially the entire resultant surface of the substrate. The gate insulating film 230 may comprise one of a silicon oxide film ($SiO_2$), a silicon nitride film ($SiN_x$), and a stacked structure thereof.

Following formation of the gate insulating film 230, a photo-resist pattern 240 is formed on the gate insulating film 230 to expose the source and drain regions of the second area Y and the third area Z. The method further comprises implanting n-type impurities with a high concentration using the photo-resist pattern 240 as an ion implanting mask, thereby forming the source and drain regions 222y in the second area Y and a lower electrode 222z of a capacitor in the third area Z.

Next, the gate insulating film 230 in the second area Y and the third area Z is removed by a predetermined thickness using the photo-resist pattern 240 as an etching mask, thereby forming gate insulating film patterns 232 with different thicknesses in the first area X, the second area Y, and the third area Z. The thicknesses of the gate insulating film patterns 232 in the second area Y and the third area Z can be changed in accordance with desired device characteristics and capacitance magnitudes. The gate insulating film patterns 232 have a first thickness on a part of the second area Y and the third area Z that is less than a second thickness on the first area X and the central portion of the semiconductor-layer pattern 220y in the second area Y, wherein the central portion of the semiconductor-layer pattern 220y in the second area Y is also the channel region.

Following formation of the gate insulating film patterns 232, the photo-resist pattern 240 is removed and a conductive layer (not shown) for a gate electrode is formed on substantially the entire resultant surface. The conductive layer for a gate electrode may comprise one of a single layer of molybdenum (Mo) or molybdenum-tungsten alloy (MoW), a single layer of aluminum (Al) or aluminum-neodymium alloy (Al—Nd), and a double layer of the above-mentioned metals.

Subsequently, by etching the conductive layer for a gate electrode using a photolithography process, for example, gate electrodes 250x and 250y are formed in the first area X and the second area Y, and an upper electrode 250z of the capacitor is formed in the third area Z. The surface area of the capacitor comprising the lower electrode 222z, the gate insulating film pattern 232, and the upper electrode 250z can be expressed by equation (1).

Next, an LDD region 224 is formed in the semiconductor-layer pattern 220y of the second area Y by implanting n-type impurity ions with a low concentration using the gate electrodes as an ion implanting mask. Following formation of the semiconductor-layer pattern 220y, a photo-resist pattern (not shown) is formed to expose the first area X and p-type impurity ions are implanted with a high concentration into the semiconductor-layer pattern 220x of the first area X, thereby forming the source and drain region 222x. Thereafter, the photo-resist pattern is removed, and then the subsequent manufacturing processes are performed.

According to the above-described embodiments of the invention, the capacitance of a capacitor may be enhanced by removing the gate insulating film, used as a dielectric film, by a predetermined thickness using a photo-resist pattern for forming the source and drain region in the area for a TFT. Thereby, the surface area of the capacitor is reduced without performing an additional mask process, and the aperture ratio of the organic electroluminescence display device is enhanced.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A semiconductor device comprising:
   first and second semiconductor-layer patterns formed on a substrate, wherein the second semiconductor-layer pattern forms a capacitor;
   an insulating film formed substantially on the entire surface of the substrate including the first and second semiconductor-layer patterns, wherein the insulating film has a first thickness on a part of the first semiconductor-layer pattern and on the second semiconductor-layer pattern, and a second thickness on a central portion of the first semiconductor-layer pattern, wherein the first thickness is less than the second thickness; and a plurality of conductive-layer patterns formed on the insulating film so as to cover the central portion of the first semiconductor-layer pattern and so as to cover the second semiconductor-layer pattern.

2. The semiconductor device according to claim 1, wherein the first semiconductor-layer pattern forms an NMOS thin film transistor.

3. The semiconductor device according to claim 1, wherein the first semiconductor-layer pattern comprises a channel region, source and drain regions, and a Lightly Doped Drain (LDD) area, and the second semiconductor-layer pattern forms a lower electrode of the capacitor.

4. The semiconductor device according to claim 1, wherein the first conductive-layer pattern forms a gate electrode and the second conductive-layer pattern forms an upper electrode of the capacitor.

5. The semiconductor device according to claim 1, wherein the insulating film is a gate insulating film.

6. The semiconductor device according to claim 1, wherein the insulating film comprises one of silicon oxide and silicon nitride.

7. The semiconductor device according to claim 1, wherein the surface area A' of a capacitor comprising the semiconductor-layer pattern, the insulating film, and the conductive-layer pattern in the second area satisfies the following equation:

$$A' = \frac{Cst}{\frac{\varepsilon GI}{tGI}}$$

wherein $\varepsilon GI$ denotes a dielectric constant of the insulating, Cst denotes a capacitance of the capacitor, and tGI denotes the thickness of the insulating film.

8. A semiconductor device comprising:

first, second, and third semiconductor-layer patterns formed on a substrate, wherein the third semiconductor-layer pattern forms at least a portion of a capacitor;

an insulating film formed substantially on the entire surface of the substrate including the first, second and third semiconductor-layer patterns, wherein the insulating film has a first thickness on a part of the second semiconductor-layer pattern and on the third semiconductor-layer pattern, and a second thickness on the first semiconductor-layer pattern and on a central portion of the second semiconductor-layer pattern, wherein the first thickness is less than the second thickness; and a plurality of conductive-layer patterns formed on the insulating film to cover the central portion of the first and second semiconductor-layer patterns and to cover the third semiconductor-layer pattern.

9. The semiconductor device according to claim 8, wherein the first semiconductor-layer pattern forms at least a portion of a PMOS thin film transistor, and the second semiconductor-layer pattern forms at least a portion of an NMOS thin film transistor.

10. The semiconductor device according to claim 8, wherein the first and second conductive-layer patterns comprise gate electrodes, and the third conductive-layer pattern comprises an upper electrode of the capacitor.

11. The semiconductor device according to claim 8, wherein the first and second semiconductor-layer patterns each comprise a channel region and source and drain regions, and the third semiconductor-layer pattern forms a lower electrode of the capacitor.

12. The semiconductor device according to claim 11, wherein the second semiconductor-layer pattern further includes a Lightly Doped Drain (LDD) region.

13. The semiconductor device according to claim 8, wherein the insulating film is a gate insulating film.

14. The semiconductor device according to claim 8, wherein the insulating film comprises at least one of silicon oxide and silicon nitride.

15. The semiconductor device according to claim 8, wherein the surface area A' of the capacitor, comprising a portion of the third semiconductor-layer pattern, a portion of the insulating film, and a portion of a conductive-layer pattern in the third area satisfies the following equation:

$$A' = \frac{Cst}{\frac{\varepsilon GI}{tGI}}$$

wherein $\varepsilon GI$ denotes a dielectric constant of the insulating film, Cst denotes a capacitance of the capacitor, and tGI denotes the thickness of the insulating film.

16. The semiconductor device according to claim 1, wherein the capacitor comprises a polysilicon layer.

17. The semiconductor device according to claim 8, wherein the capacitor comprises a polysilicon layer.

18. The semiconductor device according to claim 1, wherein the insulating film forms a dielectric of a capacitor in the second semiconductor-layer pattern and a gate insulation layer of a thin film transistor in the first semiconductor-layer pattern.

19. The semiconductor device according to claim 8, wherein the insulating film forms a dielectric of a capacitor in the third semiconductor-layer pattern and a gate insulation layer of a thin film transistor in the second semiconductor-layer pattern.

* * * * *